United States Patent [19]

Hermann et al.

[11] Patent Number: 5,112,800

[45] Date of Patent: * May 12, 1992

[54] PREPARATION OF SUPERCONDUCTING TL-BA-CA-CU-O THIN FILMS BY $Tl_2O_3$ VAPOR PROCESSING

[75] Inventors: Allen M. Hermann; Zhengzhi Sheng, both of Fayetteville, Ark.

[73] Assignee: The University of Arkansas, Little Rock, Ark.

[*] Notice: The portion of the term of this patent subsequent to Mar. 17, 2009 has been disclaimed.

[21] Appl. No.: 559,900

[22] Filed: Jul. 30, 1990

Related U.S. Application Data

[63] Continuation of Ser. No. 308,896, Feb. 9, 1989, Pat. No. 4,997,811, which is a continuation-in-part of Ser. No. 236,507, Aug. 25, 1988.

[51] Int. Cl.⁵ ............................................. B05D 5/12
[52] U.S. Cl. ........................................ 505/1; 505/742; 427/62; 427/126.3; 427/248.1; 427/343
[58] Field of Search .................. 505/1, 731, 732, 783, 505/742; 427/62, 63, 126.3, 248.1, 255, 333, 343, 53.1

[56] References Cited

U.S. PATENT DOCUMENTS

| | | | |
|---|---|---|---|
| 4,755,493 | 7/1988 | Takeuchi et al. | 501/134 |
| 4,870,052 | 9/1989 | Engler et al. | 505/1 |

FOREIGN PATENT DOCUMENTS

| | | |
|---|---|---|
| 0280812 | 9/1988 | European Pat. Off. . |
| 0284062 | 9/1988 | European Pat. Off. . |
| 0286289 | 10/1988 | European Pat. Off. . |
| 0301952 | 2/1989 | European Pat. Off. . |
| 0301958 | 2/1989 | European Pat. Off. . |
| 0316009 | 5/1989 | European Pat. Off. . |

OTHER PUBLICATIONS

Sugise et al., "Preparation of $Tl_2Ba_2Ca_2Cu_3O_y$ Thick Films from Ba-Ca-Cu-O Films", Jpn. J. Appl. Phys. 27(12), Dec. 1988, L2314-2316.

Lee et al., "Superconducting Tl-Ca-Ba-Cu-O Thin Films with Zero Resistance at Temperatures of Up to 120k," Appl. Phys. Lett. 53(4) Jul. 1988, pp. 329-321.

Lin et al., "Forming Superconducting Tl-Ca-Ba-Cu-O Thin Films by the Diffusion Method," Jpn. J. Appl. Phys. 28(1) Jan. 1989 185-87.

Johs et al., "Preparation of High Tc Tl-Ba-Ca-Cu-O Thin Films by Pulsed Laser Evaporation and $Tl_2O_3$ Vapor Processing", Appl. Phys. Lett. 54(18) May 1989, pp. 1810-1811.

Gopalakrishnan et al., "Synthesis and Properties of a 125k Superconductor in the Tl-Ca-Ba-Cu-O System", Appl. Phys. Lett. 53(5) Aug. 1988, pp. 414-416.

Qiu et al., "Formation of Tl-Ca-Ba-Cu-O Films by Diffusion of Tl into rt-Sputtered Ca-Ba-Cu-O", Appl. Phys. Lett. 53(12) Sep. 1988, pp. 1122-1124.

Wu et al., "Low-Temperature Preparation of High Tc Superconducting Thin Films", Appl. Phys. Lett. 52(9) Feb. 1988, pp. 754-756.

Liou et al., "Highly Oriented $Tl_2Ba_2Ca_2Cu_3O_{10}$ Thin Films by Pulsed Laser Evaporation", Appl. Phys. Lett. 54(8) Feb. 1989, pp. 760-762.

Hasegawa, T., et al., *High T. Superconductivity of $(La_{1-x}Sr_x CuO_4$-Effect of Substitution . . . Superconductivity*, Japan Journal of Applied Physics, vol. 26, No. 4, Apr. 20, 1987, L337-L338.

Kishio, K., et al., *Effect of Lanthanide Ion Substitutions for Lanthanum Sites on Superconductivity of $(La_{1-x}Sr_x)_2CuO_4$*, Japanese Journal of Applied Physics, vol. 26, No. 4, Apr. 20, 1987, L391-L393.

(List continued on next page.)

Primary Examiner—Shrive Beck
Assistant Examiner—Roy V. King
Attorney, Agent, or Firm—Hermann, Ivester, Hill, Van Santen, Steadman & Simpson

[57] ABSTRACT

A process of making high temperature Tl-based superconductors is disclosed. The process includes the steps of reacting solid Ba-Ca-Cu-oxides with $Tl_2O_3$ vapor. The process allows high quality Tl-based superconductors to be easily fabricated.

11 Claims, 7 Drawing Sheets

OTHER PUBLICATIONS

Ohshima, S., et al., *Superconducting and Structural Properties of the New $Ba_{1-x}Ln_xCuO_{3-y}$ Compound System ($Ln=La, Ce, Pr, Nd, Sm, Eu, \ldots$ and $Yb$)*, Japanese Journal of Applied Physics, vol. 26, No. 5, May 1987, L815–L817.

Tsurumi, S., et al., *High T. Superconductivities of $A_2Ba_4Cu_6O_{14+y}$* Japanese Journal of Applied Physics, vol. 26, No. 5, May 1987, L856–L857.

*Superconductivity News*, vol. 1, No. 2, Aug. 1987, pp. 1, 2, and 6–8.

Yang, K. N. et al., *High Temperature Superconductivity in Rare-Earth (R)-Barium Copper Oxides $(RBa_2)Cu_3O_{9-\delta}$*, Solid State Communications, vol. 63, No. 6, 1987, pp. 515–519.

Tarascon, J. M. et al., *Oxygen and Rare-Earth Doping of the 90-K Superconducting Perovskite $YBa_2Cu_3O_{7-x}$*, Physical Review B, vol. 36, No. 1, 1987, 226–234.

Hor, P. H. et al., *Superconductivity Above 90 K in the Square-Planar Compound System $ABa_2Cu_3O_{6+x}$ with $A=Y, La, Nd, Sm, Eu, Gd, Ho, Er,$ and $Lu$*, Physical Review Letters, vol. 58, No. 18, 1987, 1891–1894.

Khurana, A., *Superconductivity Seen Above the Boiling Point of Nitrogen*, Physics Today, Apr., 1987, 17–23.

Cava. R. J. et al., *Bulk Superconductivity at 91 K in Single-Phase Oxygen-Deficient Perovskite $Ba_2YCu_3O_{9-\delta}$*, Physical Review Letters, vol. 58, No. 16, 1987, 1676–1679.

Nagashima, T., et al., *Superconductivity in $Tl_{1.5}SrCaCu_2O_x$*, Japanese Journal of Applied Physics, vol. 27, No. 6, Jun., 1988, L1077–L1079.

Saito, Y., et al., *High-$T_c$ Superconducting Properties in $(Y_{1-x}Tl_x)Ba_2Cu_3O_{7-y}$, $Y(Ba_{1-x}K_x)_2Cu_3O_{7-y}$ and $YBa_2(Cu_{1-x}Mg_x)_3O_{7-y}$*, Physica 148B, 1987, 336–338.

Kondoh, S., et al., *Superconductivity in Tl-Ba-Cu-O System*, Solid State Communications, vol. 65, No. 11, 1988, 1329–1331.

Sera, M. et al., *On the Structure of High-$T_c$ Oxide System Tl-Ba-Cu-O*, Institute for Molecular Science, Myodaiji, Okazaki 444 Japan, 1988.

Ihara, H. et al., *Possibility of Superconductivity at 65° C. in Sr-Ba-Y-Cu-O System*, Japanese Journal of Applied Physics, vol. 26, No. 8, Aug., 1987, L1413–L1415.

Ishida, T., *Compositional Variation of High $T_c$ in $Yb_xEr_{1-x}Ba_2Cu_3O_{6+y}$ System*, Japanese Journal of Applied Physics, vol. 26, No. 8, Aug., 1987, L1294–L1295.

Kijima, T., et al., *Superconductivity in the Bi-Sr-La-Cu-O System*, Japanese Journal of Applied Physics, vol. 27, No. 6, Jun., 1988, L1035–L1037.

Richert, B., et al., *Atomic Substitution in $YBa_2Cu_3O_7$: Modification of the Electronic Structure*, American Institute of Physics Conference Proceedings No. 165 (Thin Film Processing and Characterization of High-Temperature Superconductors), Nov. 6, 1987, 277–283.

Ferreira, J. M., et al., *Long-Range Magnetic Ordering the High-$T_c$ Superconductors $RBa_2Cu_3O_{7-\delta}(R=Nd, Sm, Gd, Dy$ and $Er)$*, Physical Review B, vol. 37, No. 4, Feb. 1, 1988, 2368–2371.

Shih, I., et al., *Multilayer Deposition of Thallium Barium Calcium Copper Oxide Films*, Applied Physics Letter 53(6), 1988, 523–525.

Ginley, D. S., et al., *Sequential Electron Beam Evaporated Films of $Tl_2CaBa_2Cu_2O_y$ with Zero Resistance at 97 K*, Applied Physics Letters, 53 (5), Aug. 1, 1988, 406–408.

Parkin, S. S. P., et al., *Bulk Superconductivity at 125 K in $Tl_2Ca_2Ba_2Cu_3O_x$*, Physical Review, 1988, 2539–2542.

Sheng, Z. Z., et al., *Superconductivity in the Rare-Earth-Free Tl-Ba-Cu-O System Above Liquid-Nitrogen Temperature*, Nature, vol. 332, Mar. 3, 1988, 55–58.

Sheng, Z. Z., et al., *Superconductivity at 90 K in the Tl-Ba-Cu-O System*, Physical Review Letters, vol. 60, No. 10, Mar. 7, 1988, 937–940.

Sheng, Z. Z., et al., *Bulk Superconductivity at 120 K in the Tl-Ca/Ba-Cu-O System*, Nature, vol. 332, Mar. 10, 1988, 138–139.

Ihara, H. et al., *A New High-$T_c$ $TlBa_2Ca_3Cu_4O_{11}$ Superconductor with $T_c > 120 K$*, Nature, vol. 334 Aug. 11, 1988, 510–511.

Sheng, Z. Z., et al., *$Tl_2O_3$ Vapor Process of Making Tl-Ba-Ca-Cu-O Superconductors*, Appl. Phys. Lett. 53 (26), Dec. 26, 1988, 2686–2688.

Hazen, R. M., et al., *100-K Superconducting Phases in the Tl-Ca-Ba-Cu-O System*, Physical Review Letters, vol. 60, No. 16, Apr. 18, 1988, 1657–1660.

Sheng, Z. Z., et al., *New 120 K Tl-Ca-Ba-Cu-O Superconductor*, Appl. Phys. Lett., vol. 52, No. 20, May 16, 1988, 1738–1740.

Hatta, S., et al., *Pt-Coated Substrate Effect on Oxide Superconductive Films in Low-Temperature Processing*, Appl. Phys. Lett. 53(2), Jul. 11, 1988, 148–150.

(List continued on next page.)

OTHER PUBLICATIONS

Oota, A., et al., *Electrical, Magnetic and Superconducting Properties of High-$T_c$ Superconductor (Y, Sc)-(Ba, Sr)-Cu Oxide*, Japanese Journal of Appl. Physics, vol. 26, No. 8, Aug., 1987, L1356-1358.

Iwazumi, T., et al., *Identification of a Structure with Two Superconducting Phases in L-Ba-Cu-O System (L=La or Y)*, Japanese Journal of Applied Physics, vol. 26, No. 5, May, 1987, L621-L623.

Capone, II., D. W., et al., *Super Critical Fields and High Superconducting Transition Temperatures of $La_{1.85}Sr_{0.15}CuO_4$ and $La_{1.85}Ba_{0.15}CuO_4$*, Appl. Phys. Lett., 50 (9), Mar. 2, 1987, 543-544.

Johnson, D. W., et al., *Fabrication of Ceramic Articles from High $T_c$ Superconducting Oxides*, Materials Research Society, Symposium S Proceedings (High Temperature Superconductors), Apr. 1987, 193-195.

Garwin, L., *Superconducting Conference Yields New Temperature Record*, Nature, vol. 332, Mar. 10, 1988.

Suzuki, A., et al., *Rare-Earth(RE)—Barium Solubility Behavior in $Y(Ba_2-RE_x)Cu_3O_{7+\delta}$ and $Sm(Ba_{2-x}RE_x)Cu_3O_{7+\delta}$*, Japanese Journal of Applied Physics, vol. 27, No. 5, May, 1988, L792-L794.

Peters, P. N., et al., *Observation of Enhanced Properties in Samples of Silver Oxide Doped $YBa_2Cu_3O_x$*, Appl. Phys. Lett., 52 (24), Jun. 13, 1988, 2066-2067.

S. Natarajan et al., *Superconductivity Studies on $(Y_{1-x}Ln_x)Ba_2Cu_3O_7$, Ln=La,Pr,Tb*, Physica C, vol. 153-155, Feb. 1988, 926-927.

D. D. Sarma, et al., *Electronic structure of High-$T_c$ Superconductors from Soft-x-Ray Absorption*, Physical Review B, vol. 37, No. 16, Jun. 1988, 9784-9787.

K. Kishio, et al., *Superconductivity Achieved at Over Liquid Nitrogen Temperature by (Mixed Rare Earths)—Ba—Cu Oxides*, Japanese Journal of Applied Physics, vol. 26, No. 5, May 1987, L694-L696.

Waldrop, M. Mitchell, *Thallium Superconductor Reaches 125K*, Research News, Mar. 1988, 1243.

Qadri, S. B., et al., *X-ray Identification of the Superconducting High-$T_c$ Phase in the Y—Ba—Cu—O System*, Physical Review B, vol. 35, No. 13, 1987.

Murphy, D. W., et al., *New Superconducting Cuprate Perovskites*, Physical Review Letters, vol. 58, May 1987, 1888-1890.

PREPARATION OF SUPERCONDUCTING TL-BA-CA-CU-O THIN FILMS BY TL$_2$O$_3$ VAPOR PROCESSING

This is a continuation of application Ser. No. 308,896 filed Feb. 9, 1989, now U.S. Pat. No. 4,997,811, which is a continuation-in-part of U.S. patent application Ser. No. 236,507 filed on Aug. 25, 1988.

BACKGROUND OF THE INVENTION

The present invention relates generally to high temperature superconductors More specifically, the present invention relates to the fabrication of the high temperature Tl-Ba-Ca-Cu-O superconductors.

U.S. patent application Ser. No. 155,247 now U.S. Pat. No. 4,962,083, filed in the name of the inventors, of the present patent application discloses, in part, Tl-Ba-Ca-Cu-O superconductors that were discovered by the present inventors. These Tl-Ba-Ca-Cu-O superconductors have a transition temperature up to and above 120 K, this transition temperature, the inventors of the present patent application believe, is the highest to date among all existing high temperature superconductors For useful operation, the transition temperature of a superconductor typically must be at least 1/3 higher than the temperature of operation. For this reason, the Tl-Ba-Ca-Cu-O system has been called the first real liquid nitrogen temperature superconducting system.

The present existing procedures of preparing Tl-based superconductors involve the mixing of all component elements followed by a final sinter. Since Tl$_2$O$_3$ evaporates easily, the quality of the Tl-samples is not easily controlled. In addition, in view of its toxicity, Tl$_2$O$_3$ presents an additional set of difficulties during the fabrication of these types of superconductors.

An improved method for making Tl-Ba-Ca-Cu-O superconductors would be desirable for many reasons such a process would: (1) allow Tl-based superconductors to be easily constructed $\pm n$ the forms of complex bulk components, wires and fibers, and thick and thin films; (2) minimize the toxicity problem caused by Tl compounds; and (3) provide low cost processing and manufacturability.

Accordingly, there is a need for a new process of making Tl-based high temperature superconductors.

SUMMARY OF THE INVENTION

The present invention provides a new process for making Tl-based superconductors The process includes the step of reacting vapor phase Tl$_2$O$_3$ and solid Ba-Ca-Cu-oxides. Pursuant to the method of the present invention the Tl-based superconductors are produced in approximately two steps. The first step is the preparation of Ba-Ca-Cu-oxides; and the second step is the processing of the Ba-Ca-Cu-oxides by the use of Tl$_2$O$_3$ vapor to form high quality Tl-based superconductors. Pursuant to the present invention, the method of making Tl-based superconductors is simplified and only requires the manufacture of Ba-Ca-Cu-oxides and a final Tl$_2$O$_3$ vapor phase treatment.

Accordingly, an advantage of the present invention is that it provides a method which can easily produce Tl-based superconductors.

A further advantage of the present invention is to provide high quality Tl-based superconductors.

A still further advantage of the present invention is that it provides a method which can make Tl-based superconductors in the forms of bulk materials, wires or fibers, thick and thin films.

Furthermore, an advantage of the present invention is that certain elements can be added into the precursor Ba-Ca-Cu-oxides to satisfy specific needs for various applications.

An additional advantage of the present invention is that the Ba-Ca-Cu-oxides can be made in the recrystalline form of a melt.

Still another advantage of the present invention is that Tl$_2$O$_3$-vapor-processing can be carried out in closed containers.

Yet another advantage of the present invention is that it provides a method of making Tl-based superconductors which minimizes contamination by Tl compounds.

Additional advantages and features of the present invention are described in and will be apparent from, the detailed description of the presently preferred embodiments and the drawings.

DETAILED DESCRIPTION OF THE PRESENTLY PREFERRED EMBODIMENTS

Figure 1:
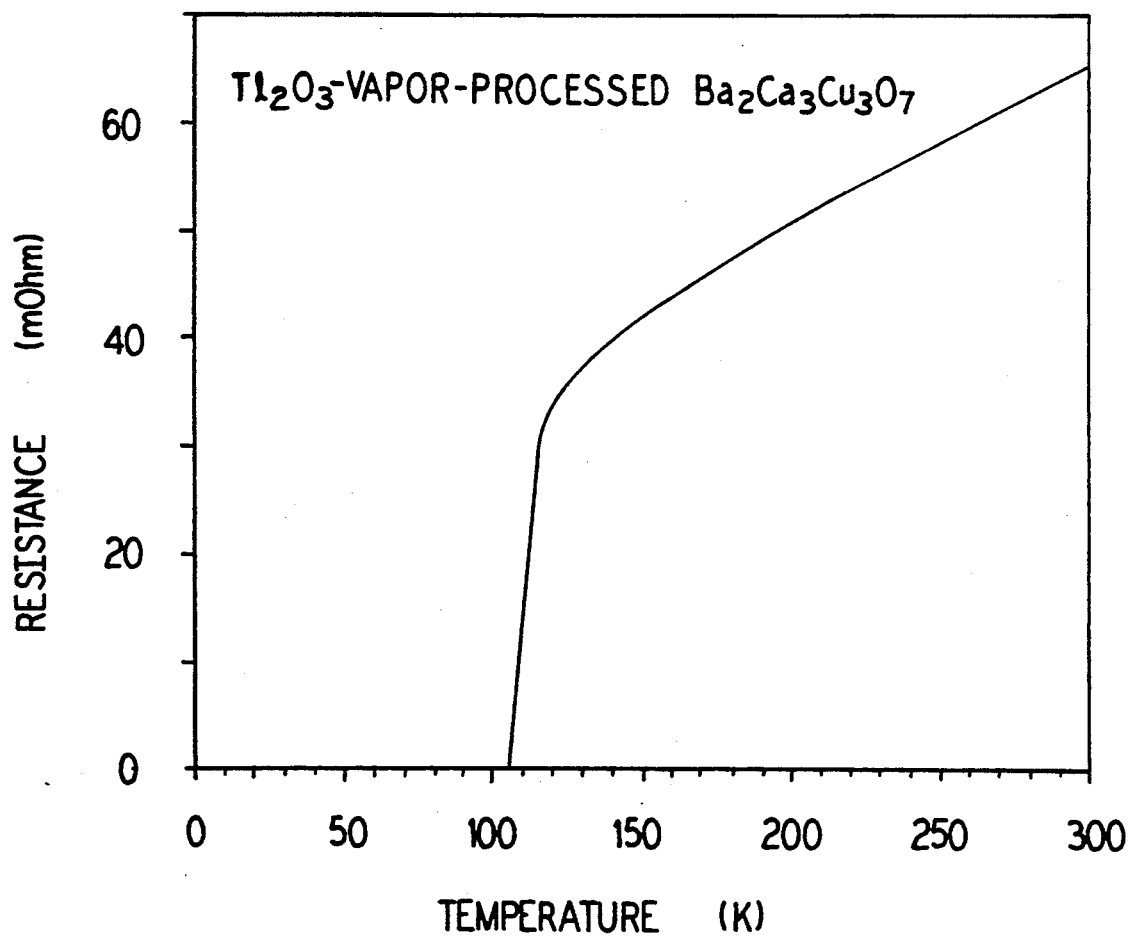
FIG. 1 illustrates the relationship of electrical resistance versus temperature for a Tl$_2$O$_3$-vapor-processed Ba$_2$Ca$_2$Cu$_3$O$_7$ sample made pursuant to the method of the present invention.

The present invention provides a method for making high quality Tl-Ba-Ca-Cu-O superconductors. The present invention is based on reactions between vapor phase Tl$_2$O$_3$ and solid Ba-Ca-Cu-oxides. The fabrication procedure for the making Tl-Ba-Ca-Cu-O superconductors according to the present invention can be divided into two steps: (1) preparation of Ba-Ca-Cu-oxides; and (2) Tl$_2$O$_3$-vapor-processing of the Ba-Ca-Cu-oxides to form Tl-Ba-Ca-Cu-O superconductors The present invention simplifies the fabrication of Tl-Ba-Ca-Cu-oxides to the fabrication of Ba-Ca-Cu-oxides, and minimizes problems caused by the toxicity and volatility of Tl compounds. The present invention allows high quality Tl-based superconductors to be easily made in the forms of complex bulk components, wires and fibers, and thick and thin films, and provides low cost processing and manufacturability of Tl-based superconductors.

Pursuant to the method of the present invention, first Ba-Ca-Cu-oxides are produced. Preferably compounds, the Ba-Ca-Cu-oxides are produced by grinding and mixing one of the following groups of: $BaCO_3$, CaO, CuO; $BaCO_3$, $CaCO_3$, CuO; $BaO_2$, $CaO_2$, CuO; or $BaO_2$, CaO, CuO. In a preferred embodiment, the molar ratio is 2:2:3, respectively, of the components. In an embodiment, the molar ratio of $BaCO_3$, CaO, CuO is 1:3:3.

Preferably, after the grinding and mixing the powder is heated. Preferably the powder is heated to approximately 925° C. for approximately 24 to about 48 hours with intermediate grindings.

In an embodiment the resultant powder has the following nominal composition:

$BaCa_xCu_yO_{1+x+y}$ wherein:

$0 \leq X \leq 100$; and $0 \leq y \leq 100$.

In an embodiment, the powder is then pressed into a pellet.

After the powder is prepared, or pressed into a pellet, it can then be reacted with $Tl_2O_3$ vapor. The $Tl_2O_3$ vapor can be produced by heating $Tl_2O_3$ with the Ba-Ca-Cu-oxides or heating any Tl-containing compound that can form $Tl_2O_3$ vapor upon being heated in oxygen to, for example, approximately 900° C.

In an embodiment, prior to being reacted with $Tl_2O_3$ vapor, the powder is mixed with a compound chosen from the group consisting of: $Tl_2O_3$, MgO, AgO, $K_2O$, $Na_2O$, $ZrO_2$, $In_2O_3$, HgO, $Bi_2O_3$, $PbO_2$, and KCl. The resultant mixture is then reacted with $Tl_2O_3$ vapor.

In an embodiment of the method of the present invention, a Ba-Ca-Cu-oxide film is created and processed with $Tl_2O_3$ to creating a superconducting thin film.

By way of example and not limitation, examples of the of the present invention process of making high quality Tl-Ca-Ba-Cu-O superconductors will now be given.

EXAMPLE 1

A. The following reagents were utilized:
1. $Tl_2O_3$,
2. CaO,
3. $BaCO_3$,
4 CuO.

B. The following procedure was followed:
1. A mixture of a two molar portion of $BaCO_3$, a two molar portion of CaO, and a three molar portion of CuO was ground with an agate mortar and pestle, heated in air at 925° C. for more than 24 hours (with several intermediate grindings) to obtain an uniform black $Ba_2Ca_2Cu_3O_7$ powder.
2. The resulting $Ba_2Ca_2Cu_3O_7$ powder was completely ground, and pressed into a pellet.
3. The pellet was heated at about 925° C. in a tube furnace for about 10 minutes.
4. The heated pellet was then taken out of the furnace and cooled in air to room temperature.
5. A small amount (approximately 0.1 to about 0.2 gm) of $Tl_2O_3$ was put in a platinum boat, and the platinum boat was placed in a quartz boat.
6. The cooled pellet was placed over the platinum boat.
7. The quartz boat, containing the platinum boat, was placed into a tube furnace which had been heated to about 900° C., and was heated for about 3 minutes in flowing oxygen.
8. The sample was then furnace-cooled to room temperature in flowing oxygen, the sample was then taken out of the furnace.

Figure 4:
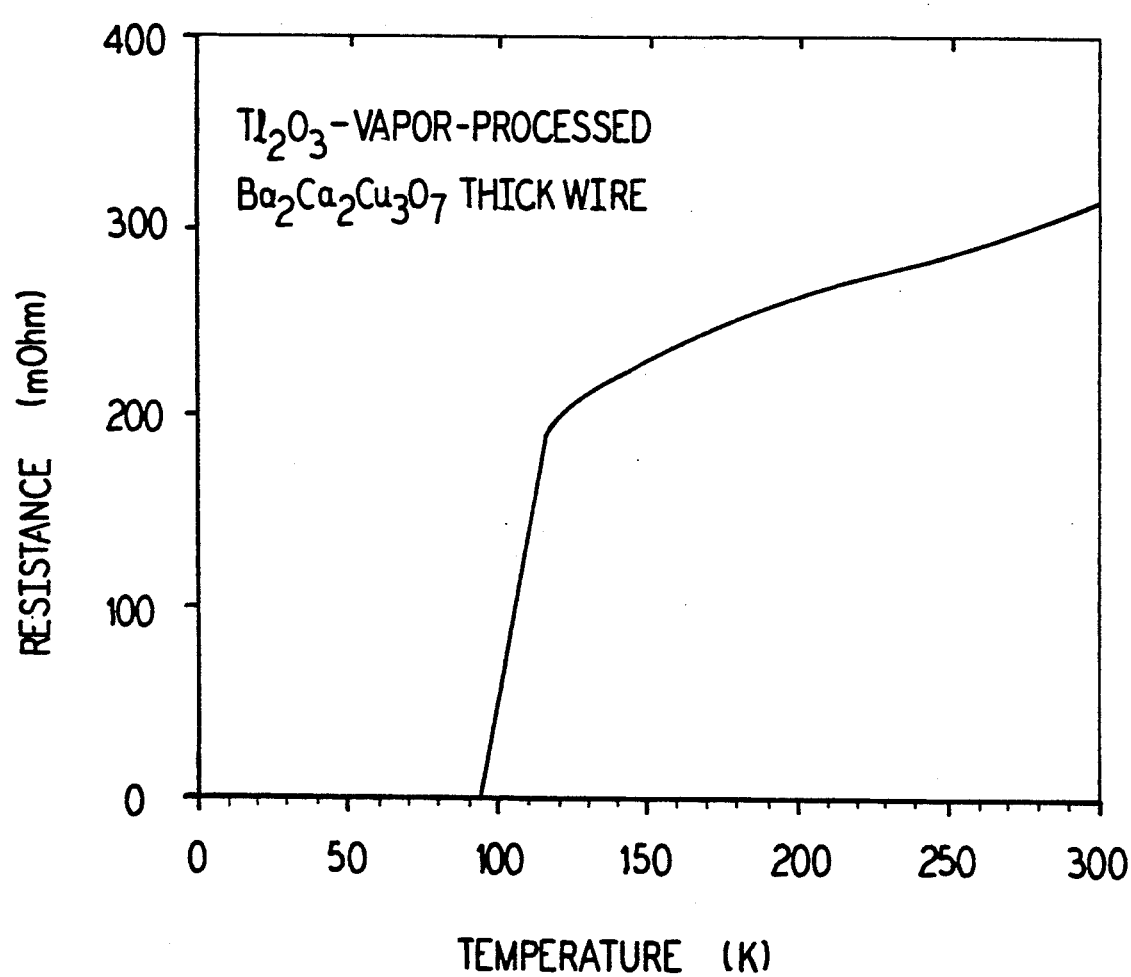
FIG. 4 illustrates resistance-temperature dependence for a Tl$_2$O$_3$-vapor-processed Ba$_2$Ca$_2$Cu$_3$O$_7$ thick wire sample made pursuant to the method of the present invention.

The samples prepared by this procedure formed a layer of superconductive compounds on their bottom surface, which had an onset temperature of above 120 k and a zero resistance temperature of above 100 k. FIG. 1 illustrates the resistance as a function of temperature for a $Tl_2O_3$-vapor-processed $Ba_2Ca_2Cu_3O_7$ sample made pursuant to this example. This sample reaches zero resistance at 104 k. FIG. 4 illustrates comparable behavior for a $Tl_2O_3$ vapor-processed $Ba_2Ca_2Cu_3O_7$ thick wire precursor made by a similar procedure.

EXAMPLE 2

A. The following reagents were utilized:
1. $Tl_2O_3$,
2. CaO,
3. $BaCO_3$,
4. CuO.

B. The following procedure was followed:
1. A mixture of a one molar portion of $BaCO_3$, a three molar portion of CaO, and a three molar portion of CuO was ground with an agate mortar and pestle, heated in air at 925° C. for more than 24 hours (with several intermediate grindings) to obtain a uniform black $BaCa_3Cu_3O_7$ powder.
2. The resulting $BaCa_3Cu_3O_7$ powder was completely ground, and pressed into a pellet.

The pellet was heated at approximately 925° C. in a tube furnace for about 10 minutes.
4. The heated pellet was then taken out of the furnace and cooled in air to room temperature.
5. A small amount (approximately 0.1 to about 0.2 gm) of $Tl_2O_3$ was placed in a platinum boat, and the platinum boat was then placed in a quartz boat.
6. The cooled pellet was placed over the platinum boat.
7. The quartz boat was put into the tube furnace which had been heated to about 900° C., and was heated for about 3 minutes in flowing oxygen.
8. The sample was then furnace-cooled to room temperature in flowing oxygen, and the sample was then taken out of the furnace.

Figure 2:
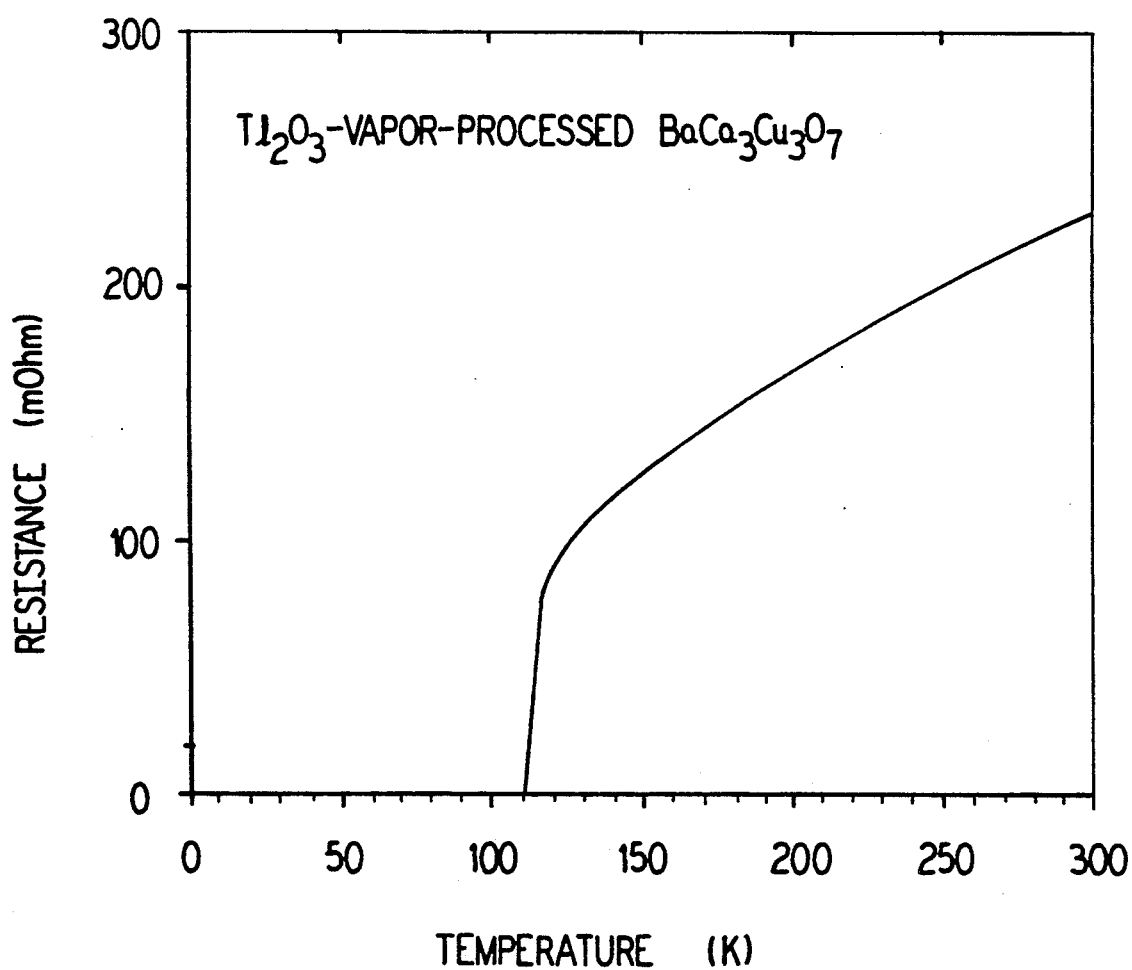
FIG. 2 illustrates the relationship of electrical resistance versus temperature for a Tl$_2$O$_3$-vapor-processed BaCa$_3$Cu$_3$O$_7$ sample made pursuant to the method of the present invention.
Figure 3:
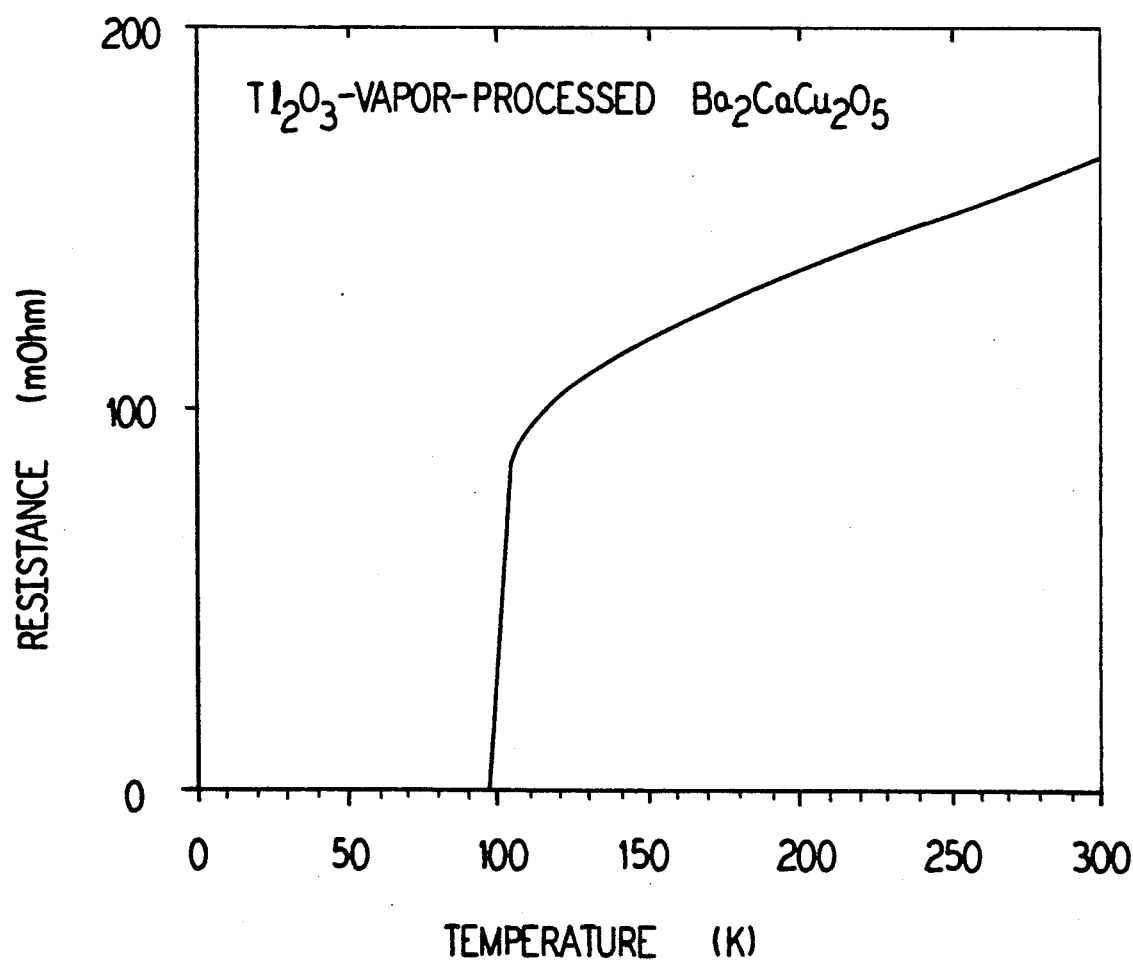
FIG. 3 illustrates the relationship of electrical resistance versus temperature for a Tl$_2$O$_3$-vapor-processed Ba$_2$CaCu$_2$O$_5$ sample made pursuant to the method of the present invention.

The samples prepared by this procedure formed a layer of superconductive compounds on their bottom surface, which had an onset temperature of above 120 K, and a zero resistance temperature of above 100 K. FIG. 2 illustrates resistance as a function of temperature for a $Tl_2O_3$-vapor-processed $BaCa_3Cu_3O_7$ sample prepared pursuant to this example. This sample reaches zero resistance at 110 K. FIG. 3 illustrates comparable behavior for a $Ba_2CaCu_2O_5$ precursor similarly prepared.

EXAMPLE 3

A. The following reagents were utilized:
1. $Tl_2O_3$,
2. $CaCO_3$,
3. $BaCO_3$,
4 CuO.

B. The following procedure was followed:
1. A mixture of a two molar portion of $BaCO_3$, a two molar portion of $CaCO_3$, and a three molar portion of CuO was ground with an agate mortar and pestle, heated in air at approximately 925° C. for more than 24 hours (with several intermediate grindings) to obtain a uniform black $Ba_2Ca_2Cu_3O_7$ powder.
2. The resulting $Ba_2Ca_2Cu_3O_7$ powder was completely ground, and pressed into a pellet.
3. The pellet was heated at approximately 925° C. in a tube furnace for about 10 minutes.
4. The heated pellet was then taken out of the furnace and cooled in air to room temperature.
5. A small amount (approximately 0.1 to about 0.2 gm) of $Tl_2O_3$ was put in a platinum boat, and the platinum boat was placed in a quartz boat.
6. The cooled pellet was placed over the platinum boat.
7. The quartz boat was put into the tube furnace which had been heated to approximately 900° C., and was heated for about 3 minutes in flowing oxygen.
8. The sample was then furnace-cooled to room temperature in flowing oxygen, and was then removed from the furnace.

The samples prepared by this procedure formed a layer of superconductive compounds on their bottom surface, which have an onset temperature of above 120 K, a midpoint of about 110 K, and a zero resistance temperature of above 100 K.

EXAMPLE 4

A. The following reagents were utilized:
 1. $Tl_2O_3$,
 2. CaO,
 3. $BaCO_3$,
 4. CuO.
B. The following procedure was followed:
1. A mixture of a two molar portion of $BaCO_3$, a two molar portion of CaO, and a three molar portion of CuO was ground with an agate mortar and pestle, heated in air at 925° C. for more than 24 hours (with several intermediate grindings) to obtain a uniform black $Ba_2Ca_2Cu_3O_7$ powder.
2. The resulting $Ba_2Ca_2Cu_3$ powder was placed on a platinum substrate which was put in a quartz boat, and was heated in a tube furnace at approximately 950 to about 1000° C. for 3-5 minutes in flowing oxygen.
3. The quartz boat was then taken out of the furnace. The $Ba_2Ca_2Cu_3O_7$ powder had melted completely, forming a layer of recrystalline Ba-Ca-Cu-O.
4. A small amount (approximately 0.1 to about 0.2 gm) of $Tl_2O_3$ was put in a platinum boat, and the platinum boat was placed in a quartz boat.
5. The platinum substrate was put over the platinum boat with the molten Ba-Ca-Cu-O facing downward.
6. The quartz boat was put into the tube furnace which had been heated to about 900° C., and was heated for about 3 minutes in flowing oxygen.
7. The sample was then furnace-cooled to room temperature in flowing oxygen, and was then taken out of the furnace.

Figure 5:
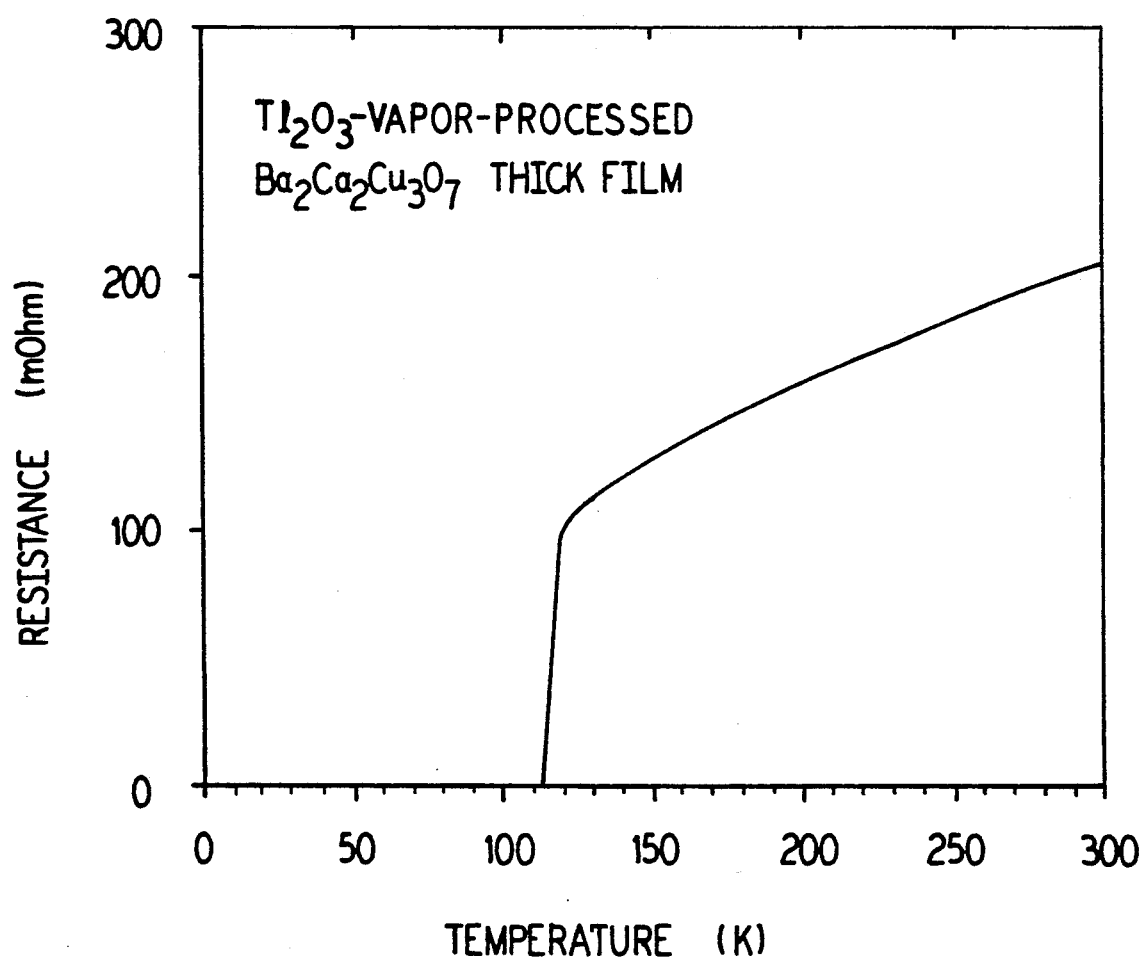
FIG. 5 illustrates resistance-temperature dependence for a Tl$_2$O$_3$-vapor-processed Ba$_2$Ca$_2$Cu$_3$O$_7$ recrystallized thick film sample made pursuant to the method of the present invention.

A $Tl_2O_3$-vapor-processed $Ba_2Cu_3O_7$ thick film was produced that was superconducting. FIG. 5 illustrates resistance as a function of temperature for a $Tl_2O_3$-vapor-processed $Ba_2Ca_2Cu_3O_7$ recrystallized thick film created pursuant to this example. The film had an onset temperature of above 120 K and reached zero resistance at about 111 K.

This experiment also shows that thin film Tl-Ca-Ba-Cu-O superconductors can be made using the $Tl_2O_3$ vapor process with appropriately deposited Ca-Ba-Cu-O precursor thin films. These thin films can be produced by depositing a thin-film of Ca-Ba-Cu-O precursor utilizing known techniques of physical or chemical deposition. These techniques include, inter alia, sputtering, evaporation, ablation, electrodeposition, electroless deposition, and chemical vapor deposition. After the thin film of Ca-Ba-Cu-O is produced, it can then be reacted with $Tl_2O_3$ vapor, for example, by placing $Tl_2O_3$ in a boat under or near the precursor and heating the boat.

EXAMPLE 5

A. The following reagents were utilized:
1. $Tl_2O_3$,
 2. $In_2O_3$,
 3. CaO,
 4. $BaCO_3$,
 5. CuO.
B. The following procedure was followed:
1. A mixture of two molar portion of $BaCO_3$, a two molar portion of CaO, and a three molar portion of CuO was ground with an agate mortar and pestle, heated in air at approximately 925° C. for more than 24 hours (with several intermediate grindings) to obtain a uniform black $Ba_2Ca_2Cu_3O_7$ powder.
2. A one molar portion of the resulting $Ba_2Ca_2Cu_3O_7$ powder was mixed with a one molar portion of $In_2O_3$, and was completely ground and pressed into a pellet.
3. The pellet was heated in a tube furnace at about 900° C. in flowing oxygen for about 3 minutes, and was then removed from the furnace.
4. A small amount (approximately 0.1 to about 0.2 gm) of $Tl_2O_3$ was put in a platinum boat, and the platinum boat was put in a quartz boat
5. The $In_2Ba_2Ca_2Cu_3O_7$ pellet was put over the platinum boat.
6. The quartz boat was then put into the tube furnace which had been heated to approximately 900° C., and was heated for about 3 minutes in flowing oxygen.
7. The sample was then furnace-cooled to room temperature in flowing oxygen, and was then removed from the furnace.

Figure 6:
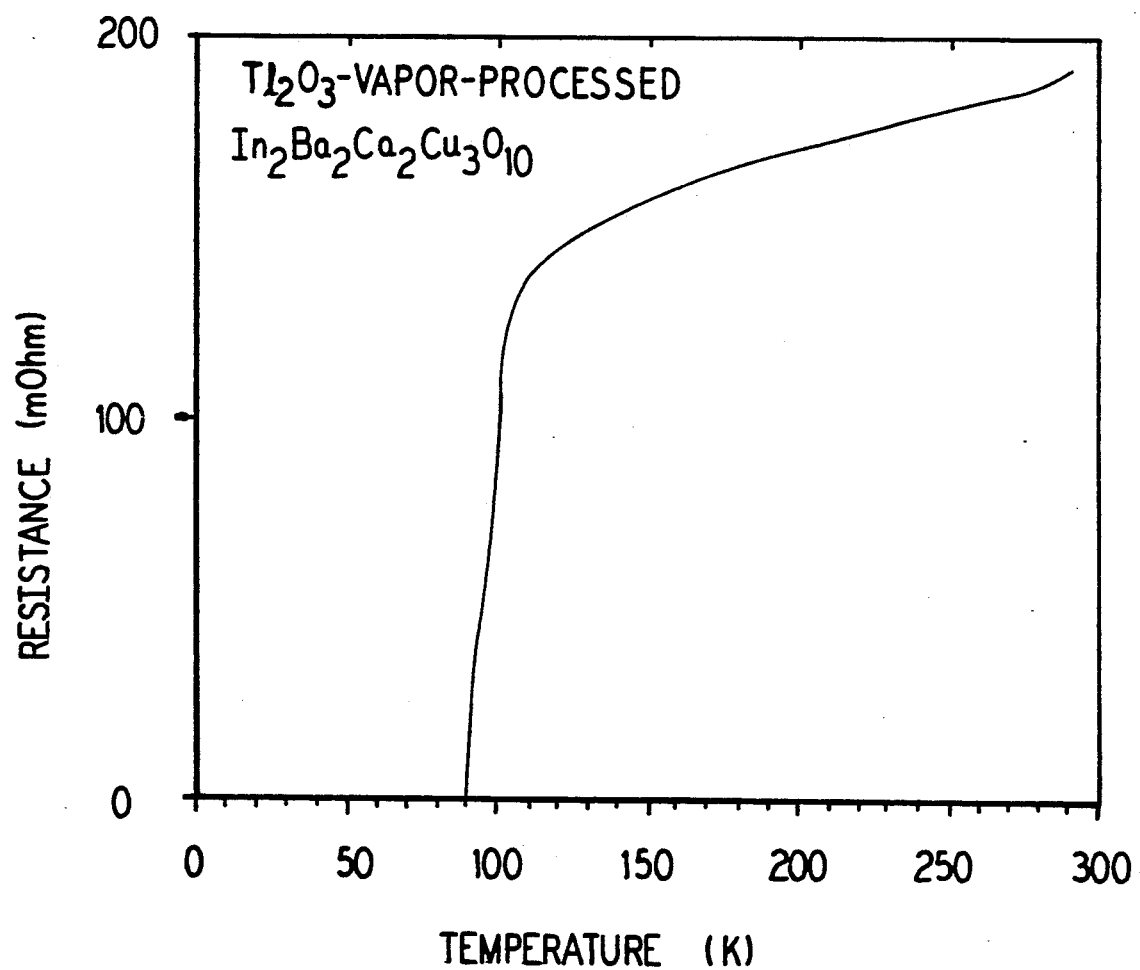
FIG. 6 illustrates resistance as a function of temperature for a Tl$_2$O$_3$-vapor-processed In$_2$Ba$_2$Ca$_2$Cu$_3$O$_{10}$ sample made pursuant to the present invention.

The bottom surface of the $Tl_2O_3$-vapor-processed $In_2Ba_2Ca_2Cu_3O_7$ sample constructed pursuant to this method was found to be superconducting FIG. 6 illustrates resistance as a function of temperature for a $Tl_2O_3$-vapor-processed $In_2Ba_2Ca_2Cu_3O_7$ sample, made pursuant to this example, which had an onset temperature about 120 K, and reached zero resistance at 89 K.

EXAMPLE 6

A. The following reagents were utilized:
 1. $Tl_2O_3$,
 2. CaO,
 3. $BaCO_3$,
 4. CuO.
B. The following procedure was followed:
A mixture of a two molar portion of $BaCO_3$, a two molar portion of CaO, and a three molar portion of CuO was ground with an mortar and pestle, heated in air at 925° C. for more than 24 hours (with several intermediate grindings) to obtain a uniform black $Ba_2Ca_2Bu_3O_7$ powder.

2. The resulting $Ba_2Ca_2Cu_3O_7$ powder was completely ground, and pressed into a pellet.
3. The pellet was heated in a tube furnace at approximately 925° C. for about 5 minutes.
4. The pellet was then taken out of the furnace and cooled in air to room temperature.
5. A small amount (approximately 0.1 to about 0.2 gm) of $Tl_2O_3$ was put in a platinum boat, and the platinum boat and cooled pellet were put in a gold container.
6. The gold container, was sealed so that the platinum boat and pellet were sealed in oxygen, was put into a tube furnace which had been heated to approximately 900° C., and was heated for about 10 minutes.
7. The gold container was then furnace-cooled to room temperature, and was removed from the furnace.
8. The gold container was opened, and the sample taken out.

This example produced a $Tl_2O_3$-vapor-processed sample that formed a layer of superconducting compounds on its surface, which had an onset temperature of above 120 K and a zero resistance temperature of above 100 K.

EXAMPLE 7

A. The following reagents were utilized:
  1. $Tl_2O_3$,
  2. CaO,
  3. $BaCO_3$,
  4. CuO.

B. The following procedure was followed:
A mixture of a two molar portion of $BaCO_3$, a two molar portion of CaO, and a three molar portion of CuO was ground with an agate mortar and pestle, heated in air at approximately 925° C. (with several intermediate grindings) to obtain a uniform black $Ba_2Ca_2Cu_3O_7$ powder.
2. The resulting $Ba_2Ca_2Cu_3O_7$ powder was mixed with $Tl_2O_3$ in a molar ratio of 1:1, and was completely ground and pressed into a pellet.
3 The pellet was heated at approximately 925° C. in a tube furnace for approximately 4 hours. The sample could have been heated for a longer time however.
4. The heated pellet was then taken out of the furnace and cooled in air to room temperature. The resultant pellet was found to have a semiconductor behavior.
5. A small amount (approximately 0.1 to about 0.2 gm) of $Tl_2O_3$ was put in a platinum boat, and the platinum boat was put in a quartz boat.
6. The resultant pellet was put over the platinum boat.
7. The quartz boat was then put into the tube furnace which had been heated to approximately 900° C., and was heated for about 3 minutes in flowing oxygen.
8. The sample was then furnace-cooled to room temperature in flowing oxygen, and was then removed from the furnace.

The resulting $Tl_2O_3$-vapor-processed sample, produced by this example, had a superconducting behavior, and had an onset temperature of above 120 K, and a zero resistance temperature of above 100 K.

EXAMPLE 8

A. The following reagents were utilized:
  1. $Tl_2O_3$,
  2. CaO,
  3. $BaCO_3$,
  4. CuO.

B. The following procedure was followed:
1. A mixture of a two molar portion of $BaCO_3$, a two molar portion of CaO, and a three molar portion of CuO was ground with an agate mortar and pestle, heated in air at 925° C. for more than 24 hours (with several intermediate grindings) to obtain a uniform black $Ba_2Ca_2Cu_3O_7$ powder. A pellet was then formed in a ⅜ inch die under pressure.
2. A $Ba_2Ca_2Cu_3O_7$ precursor film was then deposited by laser deposition from the pellet as a target onto a Y-stabilized $ZrO_2$ substrate using a frequency-doubled Nd-YAG laser operating at 523 nm, forming a Ba-Ca-Cu-O thin film with a thickness of approximately 2 to about 3 μm.
3. The thin film precursor was then placed above a platinum boat which contained approximately 0.1 to about 0.2 gram of $Tl_2O_3$, and the platinum boat was placed in a quartz boat.
4. The quartz boat and its contents was heated at 900° C. in a tube furnace for approximately 2 to about 3 minutes in flowing oxygen, and then furnace cooled to room temperature.

Figure 7:
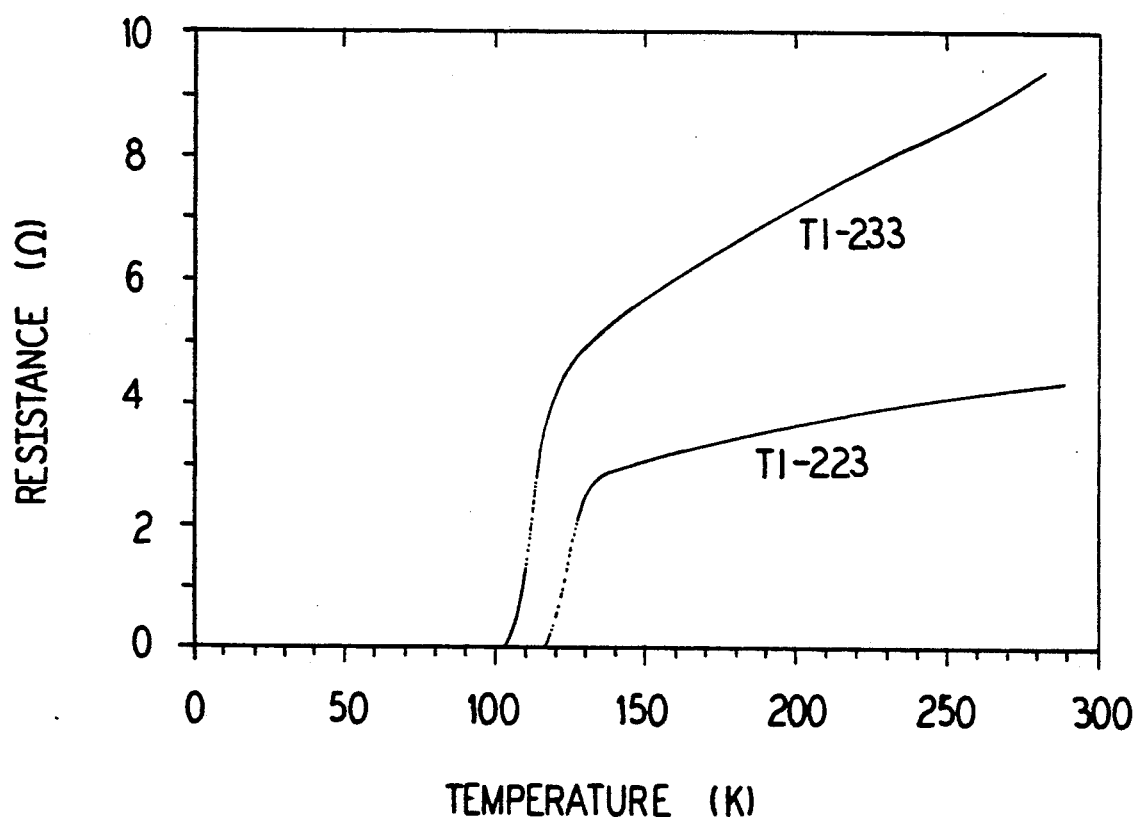
FIG. 7 illustrates the relationship of electrical resistance versus temperature for a Tl$_2$O$_3$ vapor processed Ba$_2$Ca$_2$Cu$_3$O$_7$ thin film (Tl-223) made pursuant to the present invention and a Tl$_2$O$_3$ vapor processed Ba$_2$Ca$_3$Cu$_3$O$_8$ thin film (Tl-223) made pursuant to the present invention.

A resultant $Tl_2O_3$ vapor processed $Ba_2Ca_2Cu_3O_7$ thin film was found to be superconducting with an onset temperature above 120 K and a zero resistance temperature of 115 K. The measurements of a sample prepared pursuant to this example are illustrated in FIG. 7 as Tl-223.

EXAMPLE 9

A. The following reagents were utilized:
  1. $Tl_2O_3$,
  2. CaO,
  3. $BaCO_3$,
  4. CuO.

B. The following procedure was followed:
1. A mixture of a two molar portion of $BaCO_3$, a three molar portion of CaO, and a three molar portion of CuO was ground with an agate mortar and pestle, heated in air at 925° C. for more than 24 hours (with several intermediate grindings) to obtain an uniform black $Ba_2Ca_3Cu_3O_8$ powder. A pellet was then formed in a ⅜ inch die under pressure.
2. A $Ba_2Ca_3Cu_3O_8$ precursor was deposited by laser deposition onto a Y-stabilized $ZrO_2$ substrate using a frequency-doubled Nd-YAG laser operating at 523 nm, forming a Ba-Ca-Cu-O thin film with a thickness of approximately 2 to about 3 μm.
3. The thin film precursor was placed above a platinum boat which contained approximately 0.1 to about 0.2 gram of $Tl_2O_3$, and the platinum boat was placed in a quartz boat.
4. The quartz boat and its contents was heated at 900° C. in a tube furnace for approximately 2 to about 3 minutes in flowing oxygen, and then furnace cooled to room temperature.

A resultant $Tl_2O_3$ vapor processed $Ba_2Ca_3Cu_3O_8$ thin film was found to be superconducting with an onset temperature above 120 K and a zero resistance temperature of 104 K. The measurements of a sample prepared pursuant to this method are illustrated in FIG. 7 as Tl-233.

It should be understood that various changes and modifications to the presently preferred embodiments described here in be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for making thin-film Tl-Ca-Ba-Cu-O superconductors comprising the steps of:
   a. depositing a thin-film of Ca-Ba-Cu-O precursor utilizing physical vapor deposition;
   b. placing $Tl_2O_3$ in a boat under or near the precursor thin film;
   c. heating the boat and precursor film in flowing $O_2$; and
   d. cooling the film and boat.

2. A method for making thin-film Tl-Ca-Ba-Cu-O superconductors comprising the steps of:
   mixing and heating $BaCO_3$, CaO, and CuO to obtain a Ca-Ba-Cu-O powder;
   forming a Ca-Ba-Cu-O thin film from the Ca-Ba-Cu-O powder by physical or chemical deposition; and
   heating the film in oxygen with a quantity of $Tl_2O_3$ in oxygen to create a $Tl_2O_3$ vapor processed film.

3. The method of claim 2 wherein the powder includes the composition $Ba_2Ca_2Cu_3O_7$.

4. The method of claim 2 wherein the powder includes the composition $Ba_2Ca_3Cu_3O_8$.

5. The method of claim 2 wherein two molar portions of $BaCO_3$, two molar portions of CaO, and three molar portions of CuO are ground, mixed, and heated to create the powder.

6. The method of claim 2 wherein two molar portions of $BaCO_3$, three molar portions of CaO, and three molar portions of CuO are ground, mixed, and heated to create the powder.

7. The method of claim 2 wherein the powder is created into a pellet.

8. The method of claim 7 wherein a film is deposited by laser deposition from the pallet into an Y-stabilized $ZrO_2$ substrate.

9. The method of claim 8 wherein the film has a thickness of approximately 2 to about 3 $\mu$m.

10. The method of claim 2 wherein the $Tl_2O_3$ is placed in a platinum boat and the film is placed above the boat prior to heating the film and $Tl_2O_3$.

11. The method of claim 2 wherein the quantity of $Tl_2O_3$ is approximately 0.1 to about 0.2 g.

* * * * *